US006255874B1

United States Patent
Shay

(10) Patent No.: US 6,255,874 B1
(45) Date of Patent: Jul. 3, 2001

(54) TRANSISTOR CHANNEL WIDTH AND SLEW RATE CORRECTION CIRCUIT AND METHOD

(75) Inventor: Michael J. Shay, Arlington, TX (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/363,699

(22) Filed: Jul. 28, 1999

(51) Int. Cl.[7] .................................................. H03K 5/12

(52) U.S. Cl. ............................................. 327/170; 327/333

(58) Field of Search .................................. 327/131, 133, 327/165, 166, 167, 170, 172, 175, 176, 108, 112, 350, 351, 352, 354, 333

(56) References Cited

U.S. PATENT DOCUMENTS

| | | | |
|---|---|---|---|
| 5,969,554 | * 10/1999 | Chan et al. | 327/170 |
| 6,066,971 | * 5/2000 | Pappert et al. | 327/170 |
| 6,069,509 | * 5/2000 | Labram | 327/170 |
| 6,081,134 | * 6/2000 | Labram | 326/83 |
| 6,144,240 | * 11/2000 | MacQuigg | 327/170 |

OTHER PUBLICATIONS

"Theory and Design of CMOS HSTL I/O Pads", by G.L. Esch et al. *The Hewlett–Packard Journal*, Article 5, pp. 46–52, 1998.

* cited by examiner

Primary Examiner—My-Trang Nuton
(74) Attorney, Agent, or Firm—Girard & Equitz, LLP.

(57) ABSTRACT

A driver circuit implemented in an integrated circuit for driving an output node, typically connected to another integrated circuit. The driver circuit includes a control section which produces a digital control output indicative of the state of the process used to manufacture the integrated circuit. One or more driver sections, each connected to an output node of the integrated circuit, receive the digital control output and use the output to control the state of a transistor array connected between the associated output node and circuit common. The transistor array includes an offset transistor having a channel width to channel length ratio $W_o/L_o$ and a multiplicity of adjust transistors, designated first through N, having respective channel width to channel length ratios $(W_a/L_a)_N$ approximately equal to $(W_o/L_o)(1+\Delta)^N$ where $\Delta$ is a fixed weighted value less than one, such as 0.1. Based upon the digital control output, select circuitry is used to control the impedance between the output node and circuit common by selecting a number of the adjust transistors, with the number ranging from none to N.

24 Claims, 6 Drawing Sheets

| Shifter Circuit Output (N = 0) | State (Effective Channel Width = 100 microns) |
|---|---|
| S1 | 0 |
| S2 | 0 |
| S3 | 0 |
| S4 | 0 |
| S5 | 0 |
| S6 | 0 |
| S7 | 0 |
| S8 | 0 |
| S9 | 0 |
| S10 | 0 |
| S11 | 0 |
| S12 | 0 |
| S13 | 0 |
| S14 | 0 |
| S15 | 0 |

Fig. 3A

| Shifter Circuit Output (N = 5) | State (Effective Channel Width = 160 microns) |
|---|---|
| S1 | 1 |
| S2 | 1 |
| S3 | 1 |
| S4 | 1 |
| S5 | 1 |
| S6 | 0 |
| S7 | 0 |
| S8 | 0 |
| S9 | 0 |
| S10 | 0 |
| S11 | 0 |
| S12 | 0 |
| S13 | 0 |
| S14 | 0 |
| S15 | 0 |

Fig. 3B

| Shifter Circuit Output (N = 8) | State (Effective Channel Width = 215 microns) |
|---|---|
| S1 | 1 |
| S2 | 1 |
| S3 | 1 |
| S4 | 1 |
| S5 | 1 |
| S6 | 1 |
| S7 | 1 |
| S8 | 1 |
| S9 | 0 |
| S10 | 0 |
| S11 | 0 |
| S12 | 0 |
| S13 | 0 |
| S14 | 0 |
| S15 | 0 |

Fig. 3C

| Shifter Circuit Output (N = 11) | State (Effective Channel Width = 285 microns) |
|---|---|
| S1 | 1 |
| S2 | 1 |
| S3 | 1 |
| S4 | 1 |
| S5 | 1 |
| S6 | 1 |
| S7 | 1 |
| S8 | 1 |
| S9 | 1 |
| S10 | 1 |
| S11 | 1 |
| S12 | 0 |
| S13 | 0 |
| S14 | 0 |
| S15 | 0 |

Fig. 3D

| Shifter Circuit Output (N = 15) | State (Effective Channel Width = 420 microns) |
|---|---|
| S1 | 1 |
| S2 | 1 |
| S3 | 1 |
| S4 | 1 |
| S5 | 1 |
| S6 | 1 |
| S7 | 1 |
| S8 | 1 |
| S9 | 1 |
| S10 | 1 |
| S11 | 1 |
| S12 | 1 |
| S13 | 1 |
| S14 | 1 |
| S15 | 1 |

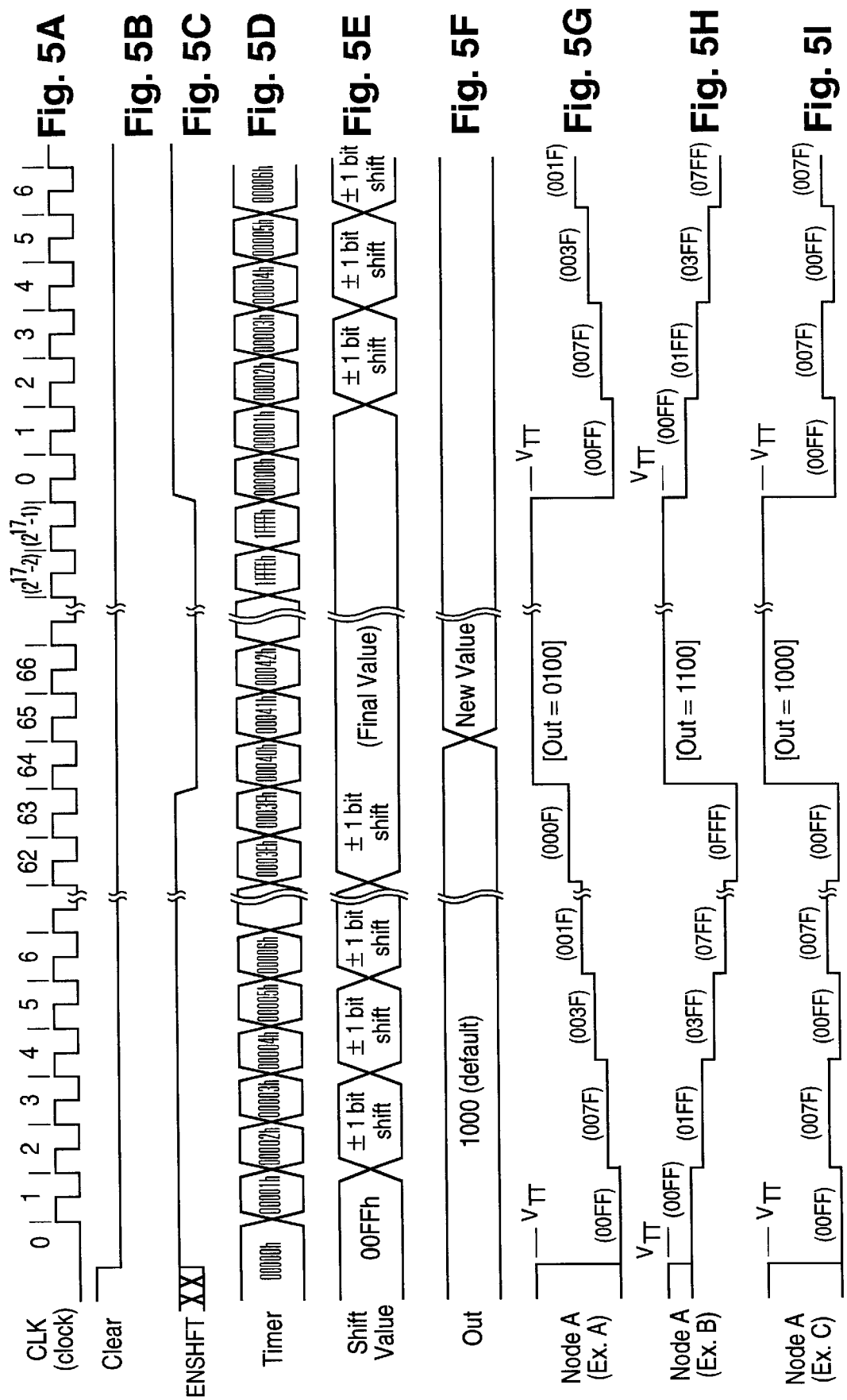

TRANSISTOR CHANNEL WIDTH AND SLEW RATE CORRECTION CIRCUIT AND METHOD

FIELD OF THE INVENTION

The present invention relates generally to control and calibration circuitry and in particular to circuitry for adjusting the effective channel width and slew rate of a multi-fingered transistor array.

DESCRIPTION OF RELATED ART

Driver circuits for transmitting data over transmission lines frequently use one or more transistors fingers as the basic driving element. As data rates increase dramatically, new types of driver circuits are required which must comply with rigid interface specifications. One such specification is the Gunning Transceiver Logic specification, commonly referred to as the GTL specification. There are variants of the GTL specification such as GTLP (or GTL+) for Gunning Tranceiver Logic Plus and AGTLP for Advanced Gunning Tranceiver Logic Plus. The GTL, GTLP and AGTLP specifications generally relate to the transmission of data between packaged integrated circuits located on a common mother board at data rates of the order of 66 MHz to 200 MHz, with a typical transmission distance being 1 to 6 inches.

The AGTLP driver includes an N-type transistor having a source connected to circuit common ($V_{SS}$) and a drain connected to the transmission line to be driven. There is some form of pull-up resistance connected to the transmission line located between the driver integrated circuit. Since the AGTLP bus may be bidirectional, both integrated circuits may have individual I/Os containing both drivers and receivers. External pull-up resistors, also known as termination resistors, are tied between the bus and a positive voltage $V_{TT}$. Thus, the driver output is pulled up to a positive voltage ($V_{TT}$) when the N-type transistor is off. The AGTLP interface specification specifies that there is a both a minimum and a maximum value of the large signal output resistance $R_{ONL}$ of the N-type transistor when the driver output is low. $R_{ONL}$ is specified to have a minimum value of 6.25 Ω and a maximum value of 16.67 Ω. In alternative products, the specification is defined in terms of a current range. For example, the current $I_{OL}$ may be specified with a minimum value of 36 mA and a maximum value of 48 mA based on a fixed value of $V_{OL}$ equal to +0.6 volts.

A typical integrated circuit will have a large number of driver circuits, each of which must operate within the $R_{ONL}$ or $I_{OL}$ specification over temperature voltage and process. Since the drain-source voltage must be small, usually no more than 0.6 volts, the transistor must be operated in the linear region where $R_{ONL}$ is largely dictated by the transistor size rather the gate-source voltage. Further, in low voltage applications, there is a limitation on the voltage range over which the gate-source voltage may be varied in order to achieve the desired control over $R_{ONL}$ or $I_{OL}$.

In addition to the above, the AGTLP specification places limitations on the slew rate of the output of the driver circuit. The falling and rising edges of the output signal must have a slew rate which has a minimum value of 0.3 volts/nanosecond and a maximum value of 0.8 volts/nanosecond based upon a fixed reference load model.

The present invention permits compliance with specifications, such as the AGTLP specification, over temperature, voltage and process. Further, operation in low voltage applications is achieved. These and other advantages of the present invention will be apparent to those skilled in the art upon a reading of the following Detailed Description of the Invention.

BRIEF DESCRIPTION OF THE DRAWINGS

FIGS. 3A through 3F are charts showing the effective channel width of the drive transistor of FIG. 2 for various values of the digital output of the FIG. 1 channel width control circuitry.

FIG. 4 is a schematic diagram of an alternative embodiment slew rate control circuit for use in the FIG. 2 drive circuit.

FIGS. 5A through 5I are timing diagram illustrating the operation of the FIG. 1 control circuitry.

SUMMARY OF THE INVENTION

A driver circuit implemented in an integrated circuit for driving an output node in response to a data signal so that the impedance between the output node and circuit common when the node is being driven is fixed notwithstanding changes in process, voltage and temperature (PVT). The driver circuit includes a control section for monitoring the PTV and producing a digital control output which received by a driver section connected to the output node. If multiple output nodes are driven, then multiple driver sections can be used having a common control section.

Each driver section includes a transistor array and select circuitry. The transistor array includes transistors connected intermediate the output node and a common node, such as circuit common, with all transistors being connected in parallel with one another. The array transistors include an offset transistor and N number of adjust transistors. The offset transistor has a ratio $W_o/L_o$ of channel width to channel length, with the adjust transistors having a respective channel width to channel length ratio $(W_a/L_a)_N$ approximately equal to $(W_o/L_o)(1+\Delta)^N$ where $\Delta$ is a fixed weighted value less than one.

The driver section further includes select circuitry configured to select a number of the adjust transistors to control the impedance between the output node and the common node in response to changes in the data signal input to the driver circuit. The number of adjust transistors selected, including zero, is determined by the digital control output from the control section. Assuming that the number selected is Y, then the adjust transistors designated by Y or less than Y will be selected and the adjust transistors designated by greater than Y will not be selected.

DETAILED DESCRIPTION OF THE INVENTION

Figure 1:
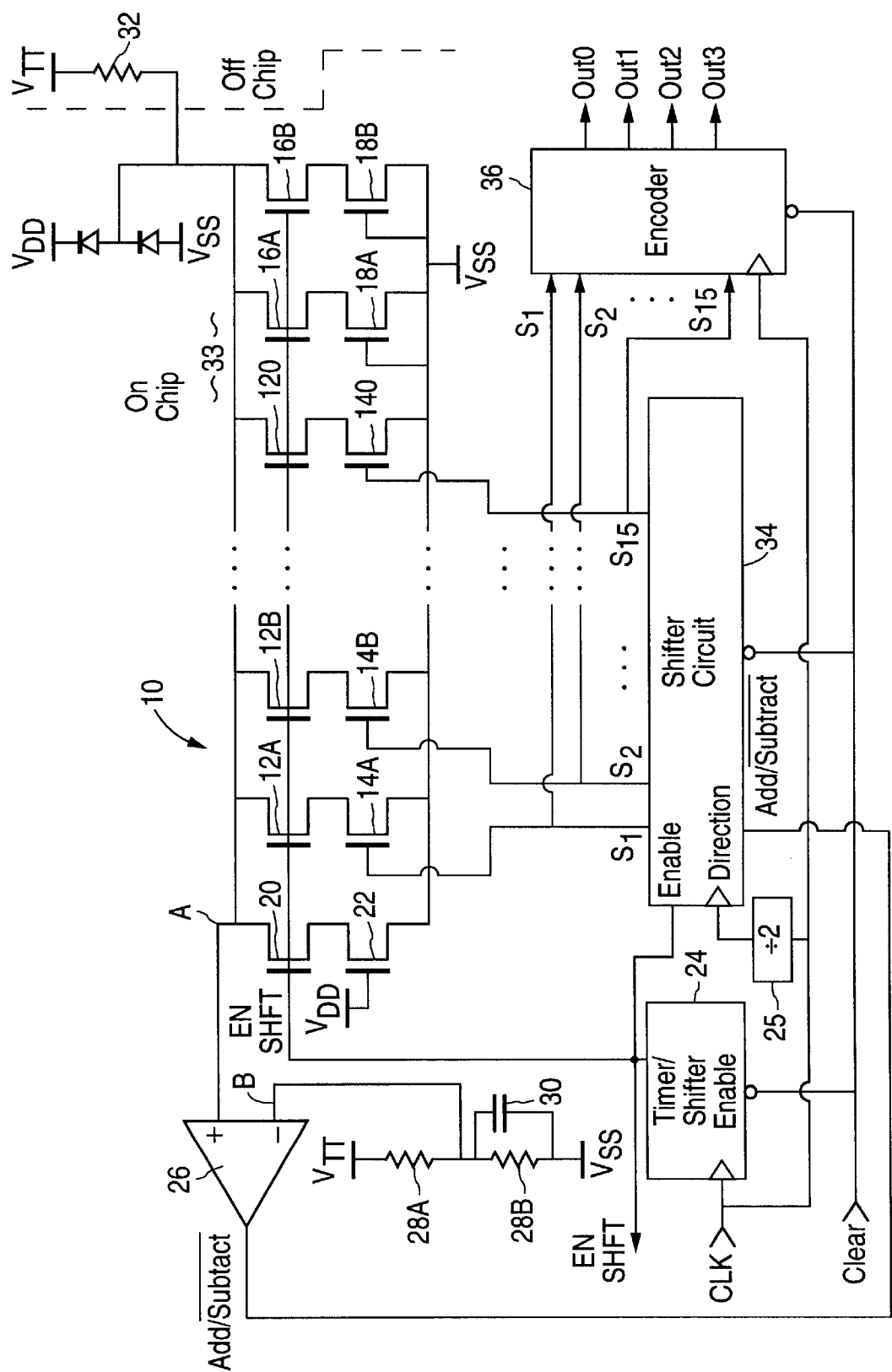
FIG. 1 is a schematic diagram of the transistor channel width control circuitry in accordance with one embodiment of the present invention.

Referring to the drawings, FIG. 1 is a schematic diagram of channel width control circuitry for use in controlling the driver portion of an I/O interface. Although the exemplary I/O interface disclosed herein is implemented to comply with the previously-described AGTLP specification, the present invention has a much wider application and is not limited to such implementation.

The channel width control circuitry includes an array 10 of N-type transistors arranged in cascoded pairs. The transistor array 10, as will be explained, is biased to model the large signal output resistance $R_{LON}$ of a driver transistor when the transistor is operating in the linear region. The state of the transistors which make up array 10 is controlled so that the resistance between node A and circuit common $V_{SS}$ is midway between the maximum specified value of $R_{ONL}$, of 16.67 Ω and the minimum value of 6.25 Ω or about 12.5 Ω. However, in order to reduce the size of the transistor array 10, the resistance is preferably doubled so that the nominal target resistance between node A and $V_{SS}$ is 25 Ω.

The exemplary array 10 includes eighteen cascoded N channel transistor pairs, with each pair including an upper control transistor which is turned on and off by a signal EN SHFT and a lower transistor. The upper transistors of array 10, sometime referred to as the enable transistors, include transistors 20, 12A–12O, 12A, 16A and 16B, each of which has a drain connected to a common node A and a gate connected to receive signal EN SHFT generated by a Timer/Shifter Enable circuit 24. The lower transistors include fifteen transistors 14A, 14B, 14C and 14D, sometimes referred to as the select transistors, having gates connected to receive fifteen select signals S1, S2, . . . and S15, respectively. The lower transistors also include a transistor 22 having its gate connected to positive voltage $V_{DD}$ which is may be as low as 1.6 volts so that the transistor is permanently biased on. Finally, the lower transistors include transistors 18A and 18B having gate connected to the circuit common $V_{SS}$ so that the transistors are off. The metal masking of these transistors can be altered so that the characteristics of array 10 can be changed as will be explained later.

The transistor width control circuitry further includes a comparator 26 having a non-inverting input connected to node A. A resistive divider comprising resistors 28A and 28B is connected between voltage supply $V_{TT}$ and circuit common $V_{SS}$. The AGTLP specification calls for voltage $V_{TT}$ to be at a nominal voltage of +1.5 volts. Resistors 28A and 28B are on-chip resistors which are matched and which track one another. In a typical application, resistors 28A and 28B are 9 KΩ and 6 kΩ, respectively so that the voltage at node B of the divider is nominally +0.6 volts. Capacitor 30 connected to the divider provides filtering.

The FIG. 1 control circuitry further includes an off-chip precision resistor 32 having one terminal connected to supply $V_{TT}$ and the other terminal connected to node A. As will be explained in greater detail, the value of resistor 32 can be selected so that the driver is capable of complying with differing driver specifications. For the AGTLP specification, precision resistor 32 is set to 37.5 Ω,±1%. Thus, when the transistor array 10 is at the target resistance of 25 Ω, the voltage at node A will be at +0.6 volts.

A synchronous Shifter circuit 34 is provided which is clocked by the output of a divide-by-two circuit 25. Circuit 25 is driven off a 66 to 200 MHz bus clock resident on the integrated circuit 33. Shifter circuit 34 has fifteen digital outputs which produce select signals S1 through S15 which control the state of transistors 14A through 14O, respectively. The select signals are a contiguous set of "1"s and/or a contiguous set of "0"s so that there are sixteen possible states. When the select signals are all "0"s, all of the fifteen associated array transistors are off. Thus, only offset transistor cascode pair 20/22 of array 10 are conductive thereby creating a relatively high resistance between node A and $V_{SS}$. When the select signals are all "1"s, all of the transistors of the array, except permanently-off transistors 18A and 18B, are on so that the resistance will be at a minimum value. When a fraction of the select signals are "1"s and "0"s, the resistance is intermediate the minimum and maximum values. The target resistance of 25 Ω is set to be midway between the maximum and minimum values.

Variations in process and changes in temperature and supply voltages can cause a dramatic difference in the on resistance provided by each of the transistors of the array. The number of permanently on transistors is selected so those transistors alone provide an effective resistance which is slightly greater than the target resistance for the fastest (lowest resistance) anticipated case. The Shifter Circuit 34 has a reset value which is selected based upon the final value of the on resistance of each transistor so that the signals S1 through S15 will initially cause the array to have an on resistance near the target value based upon typical process, voltage and temperature conditions. In the present application, the reset value of S1 through S15 will be overwritten by an initial calibration cycle prior to any AGTLP cycles so that the reset value is simply used to get S1 through S15 closed to the initial calibrated values.

The Timer/Shifter Enable circuit 24 is also a synchronous circuit driven by the bus clock. As will be explained in greater detail, circuit 24 includes an internal timer that operates to produce a signal EN SHFT every 64 cycles of the bus clock. Signal EN SHFT enables the Shifter circuit 34 so that the state of circuit 34 can be altered. As previously noted, signal EN SHFT also controls the state of the upper or enable transistors of array 10. The fifteen select signal outputs S1 through S15 of the Shifter Circuit 34 are forwarded to an Encoder circuit 36 which converts the sixteen possible outputs of the Shifter circuit 34 to a four bit value, Out0 through Out3. Values Out0 through Out3 will be used by each AGTLP compliant driver on the integrated circuit 33 for controlling the $R_{ONL}$ value for the driver.

Encoding the output of the Shifter Circuit 34 reduces the number of number of connections necessary to control each of the drivers on the integrated circuit and is thus particularly advantageous when there are a large number of such driver circuits.

Figure 2:
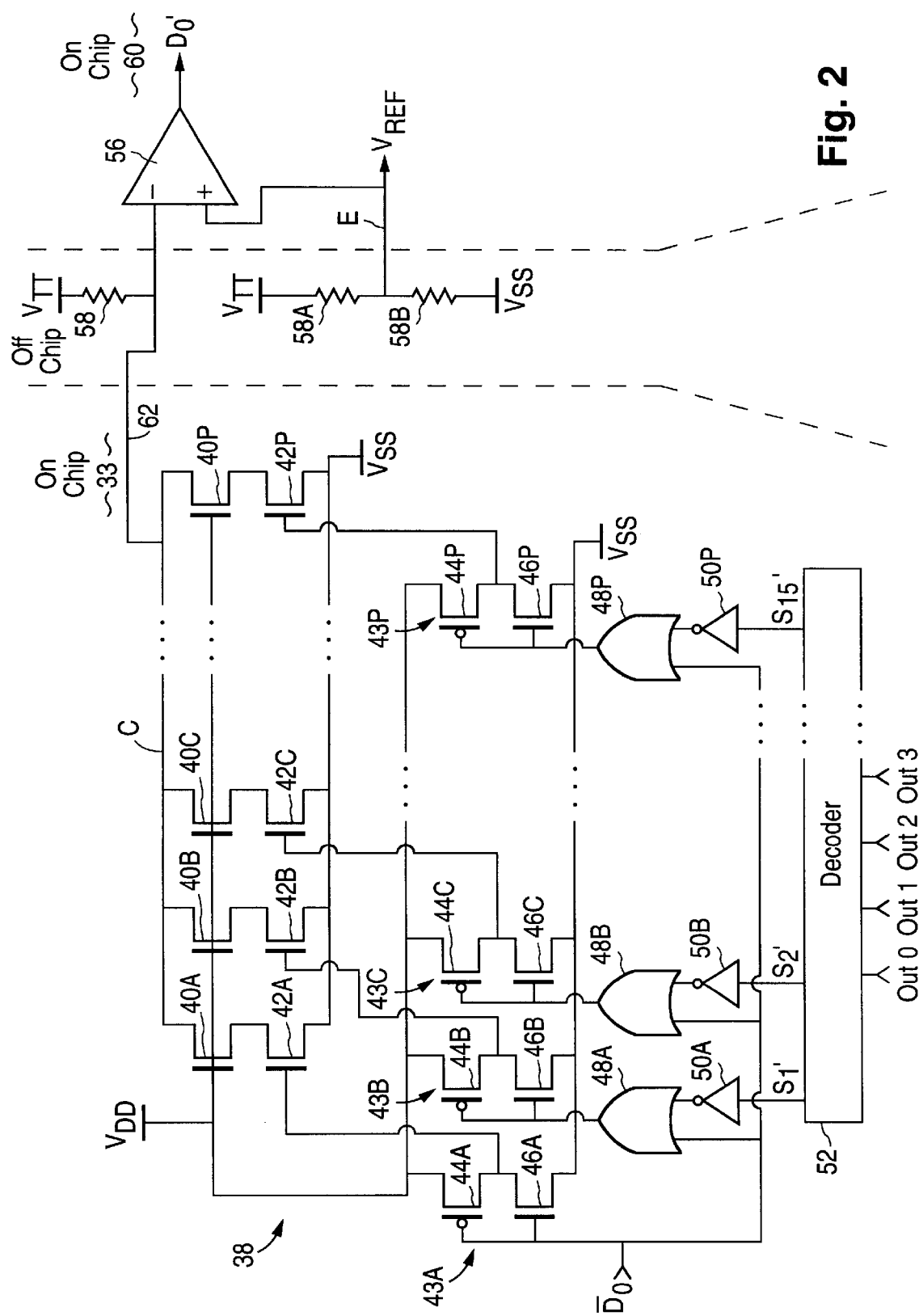
FIG. 2 is a schematic diagram of a driver circuit portion of an I/O interface of one embodiment of the invention which is responsive to the FIG. 1 channel width control circuitry.

FIG. 2 is a schematic diagram of an exemplary one of the driver circuits 33. Each driver circuit includes a transistor array 38 which is fabricated on the same integrated circuit 33 as array 10 and is implemented to have an impedance which correlates to the impedance of array 10. Array 38 differs from array 10 in that the target resistance for array 38, based upon the AGTLP specification, is 12 Ω, that being one-half the resistance of smaller array 10. Notwithstanding the difference in array size, arrays 10 and 38 will correlate very closely despite variations in voltage, temperature and process which affect both arrays in the same manner.

Array 38 includes sixteen cascoded N channel transistor pairs, including one offset cascode pair and fifteen adjust cascode pair, as will be explained. Array 38 includes sixteen upper (enable) transistors 40A through 40P. The gates of the upper transistors are directly connected to voltage $V^{DD}$ so that the transistors are permanently conductive. Lower N type transistors 42A through 42P are implemented to have differing channel widths W which are correlated to the channel widths of transistors 22 and transistors 14A through 14O of array 10 of the FIG. 1 channel width control circuitry. All of the transistors have the same channel length. Lower transistors 42A through 42P have their gates connected to the outputs of respective ramp bias generator circuits 43A through 43B. Each ramp bias generator, such as generator 43A, is implemented using a P channel transistor, such as transistor 44A and an N channel transistor, such as transistor 46A, connected in an inverter configuration.

Transistors 40A through 40B and transistors 42A through 42P of array 38 operate to provide a nominal resistance between common node C and circuit common $V_{SS}$ somewhat greater than the target resistance of 12 Ω. The actual resistance is determined by Decoder circuit 52 which, along with the other driver circuits on integrated circuit 33, receives the four bit output Out0 through Out3 from the FIG. 1 channel width control circuit. Decoder circuit 52 produces outputs S1' through S15' which correspond to outputs S1 through S15, respectively.

Digital input D0 to the FIG. 2 driver circuit is the digital signal to be transferred off-chip by the driver circuit. Input D0 is inverted to provide input $\overline{D0}$ which is thus an active low signal. Input D0 is connected directly to the input of the first ramp bias generator circuit 43A and is connected indirectly through gating circuitry to the remaining generator circuits 43B through 43P. The outputs of OR gates 48A through 48P are connected to the inputs of generators 43B through 43P, respectively. One input of each OR gate receives digital input D0, with the remaining input to the gate being respective signals S1' through S15' inverted by way of inverters 50A through 50P. Thus, for example, when S1' is a "1" and S2' through S15' are "0", the output of OR gate 48A will go low (active) when $\overline{D0}$ goes low (active). The remaining OR gates 48B through 48P will remain inactive. The falling output of OR gate 48A will cause the output of ramp bias generator 43B to produce a rising ramp output which will proceed to turn on transistor 42B. In addition, when $\overline{D0}$ goes low, the output of ramp bias generator 43A will proceed to produce a rising ramp output.

Node C of array 38 is connected to an interface line 62 that goes to a pad (not depicted) on integrated circuit 33 and then to a line connecting the transmitting integrated circuit 33 to a receiving integrated circuit 60. An off-chip pull-up resistor 58 is connected between the interface line 62 and a supply $V_{TT}$. Supply $V_{TT}$ is common to all of the integrated circuits sharing the subject interface. Resistor 58 is set to 25 Ω. Line 62 is further connected to the inverting input of a comparator circuit 56.

A reference voltage $V_{REF}$ is produced by an off-chip resistive voltage divider which includes precision (1%) resistors 58A and 58B. The divider is connected between voltage $V_{TT}$ and circuit common ($V_{SS}$). The values of resistors 58A and 582 are selected so that $V_{REF}$ at node E is equal to ⅔ of $V_{TT}$ according to the AGTLP specification.

The channel widths of transistors 40A through 40P and transistors 42A through 42P determine the target Value of $R_{ONL}$ and the range and accuracy over which $R_{ONL}$ can be maintained at the target value with variations in temperature, process and voltage. The transistors which make up each cascode pair are implemented to have the same channel width. Cascode transistor pair 40A and 42A provide the target value of $R_{ONL}$ for the fastest likely process that is likely to occur for a typical application. The faster the process, the lower the resistivity of the resultant transistors. Assume, for example, that an effective transistor width of 100 microns will result in a value of $R_{ONL}$ of 6 Ω for worst case process, temperature and voltage case. For all other processes, temperatures and voltages, $R_{ONL}$ will be larger than 6 Ω. In that case, transistors 40A and 42A, sometimes referred to as the offset transistors, will each have an effective channel width of 100 microns which, in the present example, provide a total series resistance in the linear range of 6 Ω. Under other conditions, an effective channel width of more than 100 microns will be necessary.

An important aspect of the present invention is to select the channel widths of the remaining transistors 40B through 40P and transistors 42B through 42P, sometimes referred to as the adjust transistors, such that the effective channel width will increase in a fixed percentage of the offset channel width. Thus, a weighted approach is used. The next incremental increase in channel width will be some fixed percentage greater than the offset channel width. Assuming, for example, that the fixed percentage is 10%, the next increase will be from 100 microns to 110 microns (10% of 100 microns). If a 110 microns is not adequate, the next increase will be from 110 microns to 121 microns (10% of 110 microns). Equation (1) below is the general expression for the effective channel width $W_{EFF}$ for a given percentage delta correction value.

$$W_{EFF} = (1+\Delta)^N W_{OFFSET} \tag{1}$$

where,
  $W_{OFFSET}$ is the channel width of the offset transistors (40A/42A);
  N is the most significant asserted bit (MSAB); and
  Δ is the % correction factor.

Table 1 below shows, for each value of N, the cumulative channels width and the channel width of

TABLE 1

| N (MSAB) | CUMULATIVE CHANNEL WIDTH (microns) | CALCULATED DELTA CHANNEL WIDTH (microns) | REALIZED DELTA CHANNEL WIDTH (microns) |
|---|---|---|---|
| 0 | 100 | N/A | N/A |
| 1 | 110 | 10 | 10 |
| 2 | 121 | 11 | 10 |
| 3 | 133.1 | 12.1 | 15 |
| 4 | 146.4 | 13.3 | 10 |
| 5 | 161 | 14.7 | 15 |
| 6 | 177.2 | 16.2 | 15 |
| 7 | 194.9 | 17.7 | 15 |
| 8 | 214.4 | 19.5 | 20 |
| 9 | 235.8 | 21.4 | 20 |
| 10 | 259.4 | 23.6 | 25 |
| 11 | 285.3 | 25.9 | 25 |
| 12 | 313.8 | 28.5 | 30 |
| 13 | 345.2 | 31.4 | 30 |
| 14 | 379.7 | 34.5 | 35 |
| 15 | 417.7 | 38.0 | 40 | the actual realization of transistors 40A/42A through 40P/42P for Δ of 10% and for N ranging from 0 to 15. The calculated delta channel width of Table 1 represents the increase in total effective channel width for each increasing value of N. The realized delta channel width of Table 1 represents the actual realization assuming a minimum spacing of 5 microns.

FIG. 3A shows the state of Shifter Circuit 34 where N=0 so as to provide an effective channel width of 100 microns. In that case, Shifter Circuit 34 outputs S1 through S15 are all "0's", which means that Decoder outputs S1' through S15' outputs are also all "0's". Only the cascode circuit of transistors 20/22 of the FIG. 1 array 10 is conductive and only the cascode circuit of transistors 40A/42A of the FIG. 2 array 38 is conductive.

Figures 3E, 4:
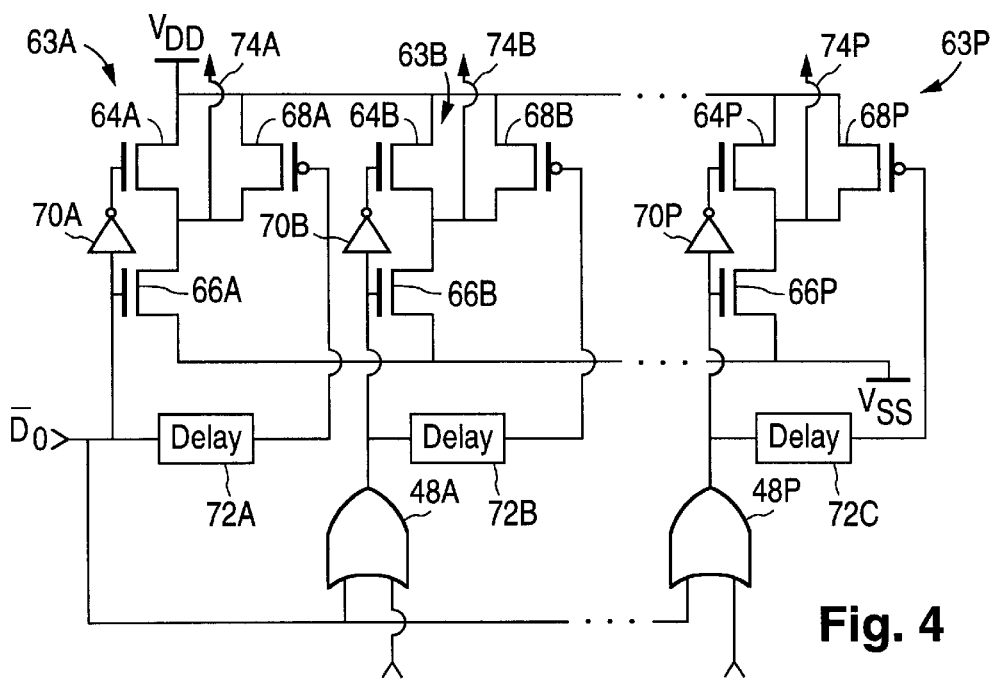

FIG. 3B shows that when outputs S1 through S5 are "1's" and the remaining outputs are "0" (N=5), so that the effective channel width is 160 microns. FIGS. 3C, 3D and 3E represent the exemplary states where N=8, N=11 and N=15, respectively. This produces effective channel widths of 215, 285 and 420 microns, respectively.

As previously noted, the AGTLP specification calls out for a maximum and minimum slew rates for the output signal at the interface. An important feature of the present invention is to provide a well controlled slew rate which remains relatively constant over process, temperature and supply voltage variations. The falling transition occurs when the output signal on line 62 (FIG. 2) drops from the high state near voltage $V_{TT}$ to the low state at approximately 400 to 600 millivolts. The falling edge slew rate is primarily controlled by the rate at which the transistors of array 38 turn-on. Since the low state, fully on output impedance (6.25 to 12.5 Ω) of array 38 is considerably lower that the board impedance (typically 56 to 75 Ω), a gradual turn-on of the transistors in array 38 must occur to reduce ringing on the mother board and ground-bouncing on the integrated circuit.

For the condition where N=0, the only transistor of array 38 that will be turned on by $\overline{D0}$ is transistor 42A (transistor 40A is always conductive). Referring again to FIG. 2, the slew rate control circuitry includes ramp bias generator 43A which produces an ramp output at the common drain connection of transistors 44A and 46A. The rising slope of the generator output is generally a function of the amount of current that pull-up transistor 44A can provide to charge the input capacitance of transistor 42A. That charge current is, in turn, a function of the size (W/L) of the transistor.

An important aspect of the present invention is the ability to directly correlate the slew rate control circuitry to the weighted approach used to select the channel widths of array 38 as set forth in Table 1. Typically, the size of transistor 44A necessary to drive transistor 42A of a given size (W=100 microns) and provide an output falling edge with the target slew rate is determined using heuristic techniques such a computer simulation. When the gate-source voltage $V_{GS}$ of the drive transistor 42A begins to increase the transistor switches from the cut-off region to the saturated region where the drain-source voltage $V_{DS}$ is greater than or equal to the difference between threshold voltage $V_{TH}$ of the transistor and the $V_{GS}$ of the transistor. Eventually, transistor 42A will enter the linear region where the $V_{DS}$ of the transistor is less than the difference between $V_{TH}$ and $V_{GS}$. However, the turn-on of the driver transistor 42A primarily and most significantly occurs where the transistor is operating in the saturation region.

The drain-source current of the driver transistor in the saturation region ($I_{DSSat}$) can be expressed by the following equation:

$$I_{DSSat} = K(W/L)(V_{GS} - V_{TH})^2 \quad (2)$$

The drain-source current of the drive transistor operating in the linear region ($I_{DSLin}$) is as follows:

$$I_{DSLin} = K(W/L)(V_{GS} - V_{TH} - V_{DS}/2)V_{DS} \quad (3)$$

As previously described, the value of N is selected to maintain the target value of $R_{ONL}$ over variations in process, temperature and supply voltage. $R_{ONL}$ is measured when the drive transistors of array 38 are operating in the linear region. As previously noted, the sizing of P type transistor 44A of the ramp bias generator 43A is determined using heuristic methods such as computer simulation. Ramp bias generator 43A is used alone when N=0, a condition which occurs for the fastest process/temperature/voltage case. To solve for a first order approximation of the remaining P type transistors of generators 432 through 43P relative to the established size of P type transistor 44A, a general solution assumes closely matched N and P type device $I_{DS}$ values for variations in process and temperature. To solve for the sizing of the remaining P type ramp bias generator transistors, the following approximate relationship exists between $I_{DSLin}$ and $I_{DSSat}$:

$$\Delta I_{DSSat} \alpha (\Delta I_{DSLin})^2 \quad (4)$$

The size of the N number of remaining P type transistors $(W/L)_N$ can be expressed in terms of a sizing coefficient $C_N$ as follows:

$$(W/L)_N = C_N(W_{OFF}/L_{OFF}) \quad (5)$$

where,
N varies from 1–15; and
$W_{OFF}/L_{OFF}$ is the size of transistor 44A.
The sizing coefficient $C_N$ is determined by the following equation:

$$C_N = (1+\Delta)^{2N} - (1+\Delta)^{2(N-1)} \quad (6)$$

Assuming that the offset P type transistor 44A is W/L= 15/2.5 and this size results in an acceptable falling transition slew rate for the fastest process/temperature/voltage case, the remaining sizes can be determined in accordance with equation (6). Table 2 below shows the sizing of the remaining P type transistors 44B through 44P of the ramp bias generators, assuming that the channel length of 2.5 microns is used so as to reduce the impact of short channel effects.

TABLE 2

| N | SIZING COEFF. $C_N$ | CHANNEL WIDTH (microns) $W_{P(N)}$ |
|---|---|---|
| 1 | 0.21 | 3.2 |
| 2 | 0.254 | 3.8 |
| 3 | 0.307 | 4.6 |
| 4 | 0.372 | 5.6 |
| 5 | 0.45 | 6.8 |
| 6 | 0.545 | 8.2 |
| 7 | 0.659 | 9.9 |
| 8 | 0.797 | 12.0 |
| 9 | 0.965 | 14.5 |
| 10 | 1.168 | 17.5 |
| 11 | 1.413 | 21.2 |
| 12 | 1.709 | 25.6 |
| 13 | 2.068 | 31.0 |
| 14 | 2.503 | 37.5 |
| 15 | 3.028 | 45.4 |

A more detailed description of the operation of the interface circuit embodiment of the subject invention will now be given. The timing diagrams of FIGS. 5A through 5I depict some of the signals of the circuit. At power on and possibly at other occasions, signal Clear is asserted by momentarily going high thereby clearing the Timer/Shifter Enable circuit 24. Signal Clear is then deasserted by going low at just prior to clock 1, as can be seen in FIGS. 5A and 5B.

As shown by FIG. 5D, the timer portion of the Timer/ Shifter Enable circuit 24 has a 17 bit output which is set to 00000h when cleared and which rolls over when the count reaches 1FFFFh. The Shifter circuit 34, when cleared, provides an output S[15:1] which is set to a predetermined default value of 00FFh. In other words, S1 through S8 are "1"'s and S9 through S15 are "0"'s. This translates to a decimal value of 8. As previously explained, the default value is estimated value set to be relatively close to the final value of the Shifter circuit 34 output. At this point, the output of Encoder circuit 36 is 1000 (Out 3, Out 2, Out 1, Out 0), this being the binary value of the default Shifter circuit output of decimal 8.

Just prior to signal Clear being deasserted, the output of Shifter circuit 34, the Shift value depicted in FIG. 5E, is indeterminate. Thus, the transistors of array 10 which are on or off is indeterminate so that the voltage at node A may fall anywhere between voltage $V_{TT}$, with all transistors off, to a lower voltage which corresponds to the default value of 00FFh (S1 through S8 are "1"'s) where transistors 20/24, 12A/14A and 12H/14H are conductive and the remaining transistors of array 10 are off. The voltage at node A is compared to the target voltage at node B by comparator 26, with the output Add/$\overline{\text{Subtract}}$ of the comparator being indicative of the relative magnitude of the voltages at nodes A and B. Assuming that the voltage at node A is smaller than the voltage at node B, in order to increase the node A voltage, the impedance between node A and the circuit common must be increased. Thus, Add/$\overline{\text{Subtract}}$ will be low so that the number of transistors of array 10 which are conductive will be decreased. The high Add/$\overline{\text{Subtract}}$ signal applied to the Shifter circuit 34 will cause the "1"'s in the Shifter circuit to shift to the left so that the total number of "1" outputs will be decreased thereby reducing the number of transistors that are conductive. The shift occurs every two clock cycles, as can be seen by FIG. 5E due to the presence of frequency divider 25. Alternatively, if the voltage at node A is larger than the target voltage at node B, signal Add/$\overline{\text{Subtract}}$ will be high thereby causing the Shifter circuit to shift to the right so that the total number of "1"'s will be increased thereby increasing the number of conductive transistors of array 10 and thereby reducing the impedance between node A and the circuit common.

The foregoing can be further illustrated by reference to Example A of FIG. 5G. In this example, voltage at node A is lower than the target voltage of node B. Signal Add/$\overline{\text{Subtract}}$ will thus be low so the number of transistors of array 10 that are conductive need to be reduced. At the beginning of clock 2 (FIG. 5A), Shifter circuit 34 is clocked by divider circuit 25 which causes the "1"'s in the Shifter circuit 34 output to shift to the left. Thus, the output S[15:1] changes from 00FFh to 007Fh. Note that the Encoder outputs Out0 through Out 3 (FIG. 5F) will remain unchanged until the calibration sequence has been completed.

Continuing with Example A, once the output of the Shifter circuit 34 has changed to 007Fh, which will result in transistors 12H/14H (not depicted) of array 10 to turn off, the voltage an node A will increase by one step at the beginning of clock 2 by approximately 37 millivolts in the present example. The voltage at node A will still be smaller than the node B target voltage so that signal Add/$\overline{\text{Subtract}}$ will remain low. This process will continue until the output of the Shifter circuit 34 has reached 001F at the beginning of clock 6. At this point, the voltage at node A is close to that of node B and within the resolution of Comparator 26. Although not shown in FIG. 5G, the Shifter circuit 34 output will toggle between 001Fh and 000Fh. At the end of the cycle at clock 64, signal EN SHFT will go low and Encoder circuit 36 will be updated with the new binary value which may be either 0100, as depicted in FIG. 5G, or 0011.

A second example is shown in FIG. 5H. In this example, the voltage at node A is below the target voltage of node B. Thus, additional transistors of array 10 are turned off until the final binary output 1100 is reached. FIG. 5I shows the toggling action where the node A voltage is within range of the target value of node B by less than or equal to the minimum resolution of the circuit. In the FIG. 5I example, the shift value toggles between 007Fh and 00FFh, one of which is finally outputted as either a binary 0111 (not depicted) or binary 1000 (depicted).

As previously described, the Encoder outputs (Out0 through out3) are forwarded to each driver circuit (FIG. 2) on the integrated circuit. The outputs are received by the Decoder 52 of each driver circuit which then produces outputs S1' through S15. These outputs are then used to control the state of the transistors of array 38 so that when digital input $\overline{\text{D0}}$ goes low, the voltage at node C is equal to that at node A (FIG. 1) and within the comparator 26 resolution to the target voltage at node B. Transistors arrays 10 and 38, in the exemplary disclosed embodiment, differ from one another only in terms of transistor geometry. The effective area of array 38 will be twice that of array 10 so that the resistance will differ by a factor of two. Since the two arrays are fabricated in a common integrated circuit and have similar transistor layout structures and ESD (electro static discharge) circuitry with only a scaling difference, there will be a strong correlation in the impedances of the two arrays (i.e., 2 to 2). When digital input $\overline{\text{D0}}$ becomes active by going low, array 38 will have a target $R_{ONL}$ of 12.5 $\Omega$, or one-half of that of array 10. Thus, since pull-up resistor 58 is 25 $\Omega$, the voltage at node C will be nominally at one-third $V_{TT}$. Since this is less than $\frac{2}{3}$ $V_{TT}$ the value of $V_{REF}$, the output of comparator 56, D0', will also be low. Conversely, when $\overline{\text{D0}}$ is inactive or high, array 38 will be off, so that node C will be pulled up to $V_{TT}$ by resistor 58. Thus, the output of comparator 56, D0', will be high.

FIG. 4 depicts an alternative implementation of the ramp bias generator circuit of FIG. 2. Ramp bias generators 63A through 63P replace generators 43A through 43P of FIG. 2. N type pull-up transistors 64A through 64P are used in lieu of the P type transistors 44A through 44P of FIG. 2. The pull-down transistors 66A through 66P remain the same. The use of N type pull-up transistors ensures a closer match with the N type transistors 42A through 42P used on the drive transistor array 38 of FIG. 2. Inverters 70A through 70P provide the correct polarity drive for the N type pull-up devices. The outputs 74A through 74P of the first ramp bias generators are connected to the gate of transistors 42A through 42P, respectively.

The N type pull-up transistors of FIG. 2 are not capable of being adequately driven to pull the ramp bias generator outputs up to a voltage approaching $V_{DD}$. Accordingly, relatively weak P type pull-up transistors 68A through 68P are provided to turn on as the generator outputs approach $V_{DD}$ to complete the ramp output. Delay circuits 72A through 72C prevent the P type transistors from turning on until needed.

Thus, a novel transistor channel width correction circuit has been disclosed. Although one embodiment of the invention in the form of an interface driver circuit has been described in some detail, it is to be understood that certain changes can be made by those skilled in the art without departing from the spirit and scope of the invention as defined by the appended claims. By way of example, the scaling factor of one to two for transistor arrays 10 and 38 is exemplary only and other ratios such as one to one, one to two and three to one, could be used.

What is claimed is:

1. A driver circuit implemented in an integrated circuit for driving an output node in response to a data signal, said driver circuit comprising:

a control section which produces a digital control output indicative of at least one of a process used to fabricate the integrated circuit, a temperature of the integrated circuit and a supply voltage of the integrated circuit; and a driver section including
(a) a transistor array which includes transistors each defining a drain source path connected in parallel with one another and connected intermediate the output node and a common node, with the transistors of the array including an offset transistor and a multiplicity of adjust transistors, with the adjust transistors designated one through N, respectively, and with the offset transistor having a ratio $W_o/L_o$ of channel width to channel length and with the adjust transistors having a respective channel width to channel length ratio $(W_a/L_a)_N$ approximately equal to $(W_o/L_o)(1+\Delta)^N$ where $\Delta$ is a fixed weighted value less than one; and
select circuitry configured to select a number of the adjust transistors to control an impedance between the output and common node in response to changes in the data signal wherein the number selected, including zero, is controlled by the digital control output.

2. The driver circuit of claim 1 further including a ramp bias generator circuit associated with each of the transistors of the transistor array, with the ramp bias generators having an output coupled to the associated array transistor, with the ramp bias generator associated with the adjust transistors having a slew rate related to the value of N of the associated adjust transistor.

3. The drive circuit of claim 2 wherein the ramp bias generator output transitions in a first direction so as to turn the associated array transistor from a low conductivity state to an increased conductivity state, with slew rate of the ramp bias generator outputs decreasing in the first direction for ramp bias generators associated with adjust transistors designated with increasing values of N.

4. The driver circuit of claim 1 further including a ramp bias generator circuit associated with each of the transistors of the transistor array, with the ramp bias generator circuits having an output coupled to the associated array transistor, with each of the ramp bias generator circuits including an output transistor, with the output transistor of the ramp bias generators associated with the adjust transistors having a differing ratio of channel width to channel length $W_{ag}/L_{ag}$.

5. The driver circuit of claim 4 wherein the channel width to channel length ratio $W_{ag}/L_{ag}$ of the output transistors of the ramp bias generator circuits associated with the adjust transistors are related to the channel width to channel length ratio $W_{og}/L_{og}$ of the output transistor of the ramp bias generator associated with the offset transistor by a variable sizing coefficient $C_N$, with $C_N$ changing for each value of N.

6. The driver circuit of claim 5 wherein $C_N$ is approximately equal to $(1+\Delta)^{2N}-(1+\Delta)^{2(N-1)}$.

7. A driver circuit implemented in an integrated circuit for driving an output node in response to a data signal, said driver circuit comprising:
a control section which produces a digital control output indicative of a conductivity of a circuit element formed in the integrated circuit; and
a driver section including
(a) a transistor array which includes transistors each defining a drain source path connected in parallel with one another and connected intermediate the output node and a common node, with the transistors of the array including an offset transistor and a multiplicity of adjust transistors, with the adjust transistors designated one through N, respectively, and with the offset transistor having a ratio $W_o/L_o$ of channel width to channel length and with the adjust transistors having a respective channel width to channel length ratio $W_a/L_a$ which increases with the value of N designating the adjust transistor; and
select circuitry configured to select a number of the adjust transistors to control an impedance between the output and common node in response to changes in the data signal wherein the number selected, including zero, is controlled by the digital control output.

8. The driver circuit of claim 7 wherein the adjust transistors have a respective channel width to channel length ratio $(W_a/L_a)_N$ approximately equal to $(W_o/L_o)(1+\Delta)^N$ where $\Delta$ is a fixed weighted value less than one.

9. The driver circuit of claim 7 wherein the select circuitry operates so that when Y number of adjust transistors are selected, all of the adjust transistors designated less than and equal to Y are selected and all of the adjust transistors designated greater than Y are not selected.

10. The driver circuit of claim 9 wherein the select circuitry includes a digital circuit having first through N digital outputs associated with the first through N adjust transistors, respectively, so that all of the digital outputs less than or equal to Y are at one state and all of the digital outputs greater than Y are at a second state, opposite the first state.

11. The driver circuit of claim 10 further including a ramp bias generator associated with each of the transistors of the transistor array, with the ramp bias generators having an output coupled to the associated transistor, with each of the ramp bias generator circuits including a first output transistor, with the first output transistor of the ramp bias generators associated with the adjust transistors having a differing ratio of channel width to channel length $W_{ag}/L_{ag}$.

12. The driver circuit of claim 11 wherein the channel width to channel length ratio $W_{ag}/L_{ag}$ of the first output transistors of the ramp bias generator circuits associated with the adjust transistors are related to the channel width to channel length ratio $W_{og}/L_{og}$ of the output transistor of the ramp bias generator associated with the offset transistor by a variable sizing coefficient $C_N$, with $C_N$ changing for each value of N.

13. The driver circuit of claim 12 wherein $C_N$ is approximately equal to $(1+\Delta)^{2N}-(1+\Delta)^{2(N-1)}$.

14. The driver circuit of claim 12 wherein the ramp bias generator circuits each includes a second output transistor each defining a source-drain path connected in series with a source-drain path of the first output transistor of the ramp bias generator circuit, with the first output transistor being connected intermediate a first supply voltage and the second output transistor being connected intermediate the first output transistor and a second supply voltage, with the first supply voltage being positive with respect to the second supply voltage.

15. The driver circuit of claim 14 wherein the circuit element of the control section includes an N type transistor and wherein the first output transistors of the ramp bias generator circuits are P type transistors.

16. The driver circuit of claim 14 wherein the circuit element of the control section includes an N type transistor and wherein the first output transistors of the ramp bias generator circuits are N type transistors.

17. The driver circuit of claim 10 wherein the control section includes a digital encoder circuit which produces the digital control output and wherein the digital circuit of the select circuitry includes a digital decoder circuit which receives the digital control output.

18. A method of controlling conductivity of a first electrical path formed in an integrated circuit between an output node and a first node comprising:

producing a digital control output indicative of conductivity of a second electrical path formed in the integrated circuit;

providing a transistor array which includes transistors each defining a drain-source path connected in parallel with one another and connected intermediate the output node and the first node, with the transistors of the array including an offset transistor and a multiplicity of adjust transistors, with the adjust transistors designated one through N, respectively, and with the offset transistor having a ratio $W_o/L_o$ of channel width to channel length and with the adjust transistors having a respective channel width to channel length ratio $W_a/L_a$ which increases with the value of N designating the adjust transistor; and controlling conductivity of the adjust transistors by selecting Y number of the adjust transistors, including zero, based upon the digital control output, with the adjust transistors designated Y or less being selected and with the adjust transistors designated greater than Y being not selected.

19. The method of claim 18 wherein the adjust transistors have a respective channel width to channel length ratio $(W_a/L_a)_N$ approximately equal to $(W_o/L_o)(1+\Delta)^N$ where $\Delta$ is a fixed weighted value less than one.

20. The method of claim 18 further including controlling a slew rate of a separate drive signal applied to each of the adjust transistors so that the slew rate of the drive signal increases with adjust transistors having increasing values of N.

21. The method of claim 18 wherein the producing a digital control output includes providing a second transistor array which includes N+1 number of transistors connected in parallel to form the second electrical path.

22. The method of claim 21 wherein the producing includes determining a value of Y by selectively enabling transistors of the second transistor array.

23. A method of controlling conductivity of a first electrical path formed in an integrated circuit between an output node and a first node comprising:

providing a first transistor array formed in the integrated circuit which includes a multiplicity of transistors each defining a drain-source path connected in parallel with one another and intermediate second and third nodes;

producing a digital control output by selectively enabling the transistors of the first transistor array;

providing a second transistor array which includes transistors each defining a drain-source path connected in parallel with one another and connected intermediate the output node and the first node, with the transistors of the array including a multiplicity of adjust transistors, with the adjust transistors designated one through N, respectively; and controlling conductivity of the adjust transistors by selecting Y number of the adjust transistors, including zero, based upon the digital control output, with the adjust transistors designated Y or less being selected and with the adjust transistors designated greater than Y being not selected.

24. The method of claim 23 wherein the second transistor array transistors include an offset transistor having a ratio $W_o/L_o$ of channel width to channel length and with the adjust transistors having a respective channel width to channel length ratio $(W_a/L_a)_N$ approximately equal to $(W_o/L_o)(1+\Delta)^N$ where $\Delta$ is a fixed weighted value less than one.

* * * * *